US006223141B1

(12) United States Patent
Ashar (10) Patent No.: US 6,223,141 B1
(45) Date of Patent: Apr. 24, 2001

(54) SPEEDING UP LEVELIZED COMPILED CODE SIMULATION USING NETLIST TRANSFORMATIONS

(75) Inventor: Pranav Ashar, Princeton, NJ (US)

(73) Assignee: NEC USA, Inc., Princeton, NJ (US)

( * ) Notice: Subject to any disclaimer, the term of this patent is extended or adjusted under 35 U.S.C. 154(b) by 0 days.

(21) Appl. No.: 09/115,668

(22) Filed: Jul. 14, 1998

(51) Int. Cl.$^7$ ................................................ G06F 9/455
(52) U.S. Cl. .............................. 703/14; 703/17; 703/19; 703/27
(58) Field of Search ................................ 703/14, 17, 19, 703/16, 27; 395/500.04, 704, 705

(56) References Cited

U.S. PATENT DOCUMENTS

| | | | |
|---|---|---|---|
| 5,550,760 | * 8/1996 | Razdan et al. | 364/578 |
| 5,694,579 | * 12/1997 | Razdan et al. | 395/500 |
| 5,784,593 | * 7/1998 | Tseng et al. | 395/500 |
| 5,809,283 | * 9/1998 | Vaidyanathan et al. | 395/500 |
| 5,892,940 | * 4/1999 | Mangelsdorf | 395/500 |

OTHER PUBLICATIONS

Z. Barzilai, et al., "HSS—A High Speed Simulator," *IEEE Transactions on Computer–Aided Design*, vol. C–6, pp. 601–617, Jul. 1987.
R. Brayton, et al., "MIS: A multiple–level logic optimization system," *IEEE Transactions on CAD*, vol. C–6, pp. 1062–1081, Nov. 1987.
M. Chiang, et al., "LCC simulators speed development of synchronous hardware," *Computer Design*, pp. 87–91, 1986.
N. Ishiura, et al., "High–speed logic simulation on a vector processor," *Proceedings of the International Conference on Computer–Aided Design*, pp. 119–121, Nov. 1985.

G. F. Pfister, "The Yorktown Simulation Engine: Introduction," *The Proceedings of the Design Automation Conference*, pp. 51–54, Jun. 1982.
E. J. Shriver, et al., "Ravel: Assigned–delay compiled–code logic simulation," *Proceedings of the International Conference on Computer–Aided Design*, pp. 364–368, Nov. 1992.
E. Ulrich, "Exclusive simulation of activity in digital networks," *Communications of the ACM*, vol. 13, pp. 102–110, Feb. 1969.
L. T. Wang, et al., "SSIM: A software levelized compiled–code simulator," *The Proceedings of the Design Automation Conference*, pp. 2–8, Jun. 1987.
G. Hachtel, et al., "Logic Synthesis and Verification Algorithms," Kluwer Academic Publishers, Norwell, MA, Jun. 1996, Chapter 10.
P. Ashar, et al., "Fast Functional Simulation Using Branching Programs," *Proceedings of the International Conference on Computer–Aided Design*, pp. 408–412, Nov. 1995.
N. Shenoy, et al., "Efficient Implementation of Retiming," *Proceedings of the International Conference on Computer–Aided Design*, pp. 226–233, Nov. 1994.

* cited by examiner

*Primary Examiner*—Kevin J. Teska
*Assistant Examiner*—Thai Phan
(74) *Attorney, Agent, or Firm*—Sughrue, Mion, Zinn, Macpeak & Seas, PLLC

(57) ABSTRACT

Delay-independent cycle-based logic simulation of synchronous digital circuits with levelized compiled code simulation has substantially increased speed. Sweep, eliminate, and factor reduce the number of literals. The use of cofactoring, a register allocation and spill scheme, an inverter minimization scheme, and retiming further reduce the simulation time for two and four valued simulation. A shift minimization scheme reduces time in four-valued simulation. The faster simulation is embodied in a method, a computer system, and a computer program product.

36 Claims, 4 Drawing Sheets

□ % Reduct. in Total Instr. Count
▨ % Incr. in Load/Store

FIG. 8

□ Total Instructions
▨ Loads/Stores

SPEEDING UP LEVELIZED COMPILED CODE SIMULATION USING NETLIST TRANSFORMATIONS

BACKGROUND OF THE INVENTION

1. Field of the Invention

This work addresses the problem of speeding up levelized compiled code generation based functional (delay independent) logic simulation for synchronous digital systems. In particular, the invention relates to methods for manipulation of the netlist to be simulated so that the simulation speed is increased.

2. Description of Related Work

In designing digital systems, it is important to validate the design of the interconnected logic gates. This may be referred to as design validation.

For today's large and complex systems, it is preferred to validate the design by simulation. Design validation by simulation is a key step in the design cycle of digital systems. It is also one of the most time consuming. Each time a design is iterated, it must be re-simulated until a satisfactory confidence level is achieved.

Simulation is performed at various levels of abstraction during the design process. One level of simulation involves delay-independent (i.e. purely functional) cycle-based logic simulation of synchronous digital circuits. At this level, the simulator is required to determine the output sequence produced by a circuit for a sequence of input vectors, independent of the delays associated with the gates and wires. In effect, the simulator determines the output vector for each input vector by evaluating the Boolean equations associated with each gate in the circuit. The circuit is assumed to possess feedback through flip-flops. Therefore, the circuit can be evaluated for the next input vector only after the evaluation for the current input vector is complete. This type of simulation where the input vectors must be simulated sequentially in this is manner is said to be cycle-based sequential simulation.

It will be understood that circuit timing may be checked using static timing analysis. Circuit initialization may be checked using an event driven front end used for simulation of a few thousand cycles. The bulk of the verification tests are done using a pure binary valued functional simulator.

This invention relates particularly to delay-independent (i.e. purely functional) cycle-based logic simulation of synchronous digital circuits. This invention relates, more particularly, to solving the problem that prior simulation methods have been too slow.

Two techniques have traditionally been applied for logic simulation at this level. One technique is event-driven simulation. For their useful background on this topic, the following are incorporated by reference:

M. A. Breuer and A. D. Friedman. *Diagnosis and Reliable Design of Digital Systems.* Computer Science Press, Inc., 1976.

E. Ulrich. Exclusive simulation of activity in digital networks. In *Communications of the ACM,* volume 13, pages 102–110, February 1969.

The other to the two techniques traditionally applied for logic simulation at this level is levelized compiled-code (LCC) simulation. The following, which are incorporated by reference, provide useful background on prior efforts in LCC simulation:

M. Chiang and R. Palkovic. LCC simulators speed development of synchronous hardware. In *Computer Design,* pages 87–91, 1986.

N. Ishiura, H. Yasuura, T. Kawata, and S. Yajima. High-speed logic simulation on a vector processor. In *Proceedings of the International Conference on Computer-Aided Design,* pages 119–121, November 1985.

G. F. Pfister. The Yorktown Simulation Engine: Introduction. In *The Proceedings of the Design Automation Conference,* pages 51–54, June 1982.

L. T. Wang, N. H. Hoover, E. H. Porter, and J. J. Zasio. SSIM: A software levelized compiled-code simulator. In *The Proceedings of the Design Automation Conference,* pages 2–8, June 1987.

Figure 1A:
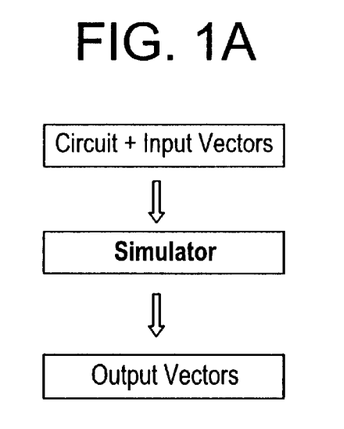
Figure 1B:
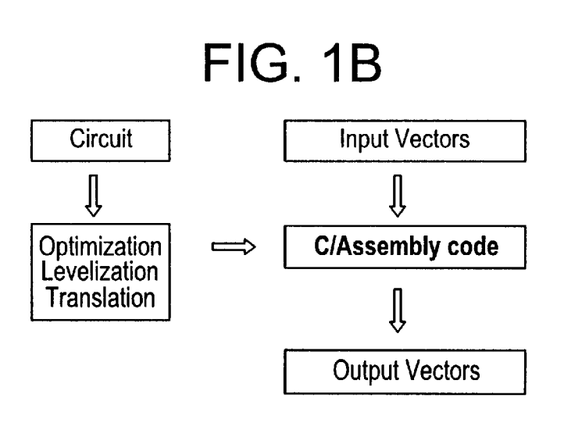

FIG. 1 presents a high-level view of how these simulators are used. It has been observed in practice that levelized compiled-code simulation is much faster than event driven simulation for purely functional simulation of current designs.

Event-Driven (ED) Simulation

In event-driven simulation, the output of a gate is evaluated only when there is a change in the value of one of its inputs. In effect, gates are dynamically scheduled for evaluation at run time. The running time of this approach for some input vector is roughly proportional to the number of signal transitions (or events) in the circuit for that input vector. Consequently, this approach tends to be very fast when the amount of activity (ratio of the number of signal transitions to the number of signals) in the circuit is low (between 1 and 20%). In practice though, much higher activity is observed in current designs as maximal use of silicon is attempted through parallelism and pipelining. For more information on this point, see the following publication, incorporated by reference for its background:

E. J. Shriver and K. A. Sakallah. Ravel: Assigned-delay compiled-code logic simulation. In *Proceedings of the International Conference on Computer-Aided Design,* pages 364–368, November 1992.

A large overhead must be paid in event-driven simulation for the flexibility of scheduling gates dynamically. A consequence of this overhead is that when the activity level increases, event-driven simulation becomes much slower than the levelized compiled-code approach described below.

On the positive side, dynamic scheduling of gates allows arbitrary signal propagation delay models to be incorporated into this approach. This allows essentially the same event-driven framework to be used for both delay-dependent and delay-independent simulation, as well as for the simulation of circuits with asynchronous feedback. As mentioned in the Shriver and Sakallah publication, the proliferation of synchronous designs has made the need for simulation of asynchronous feedback virtually unnecessary. The event-driven approach is still required for delay-dependent simulation, although attempts have been made to incorporate arbitrary delays into the compiled-code paradigm.

Levelized Compiled-Code (LCC) Simulation

In levelized compiled-code simulation, all the gates are evaluated for each input vector even if the gate output has not changed since the last input vector. As the name suggests, the circuit is first levelized topologically. Here, the level of a gate is defined as the largest number of gates on any path to it from a primary input. The gates are always evaluated in the order of increasing level. This ordered sequence of gates is translated into C-code. Each gate is either coded using its constituent Boolean equations or by means of a look-up table characterizing its I/O behavior. This C-code is then compiled into a binary which accepts as input the simulation vectors, and generates as output the output vector that would be produced by the original circuit.

Given that the gates are scheduled statically, a restriction of the levelized compiled-code approach is that non-zero signal propagation delays cannot be incorporated into the simulation easily. The run time for each input vector is proportional to the number of gates in the circuit, or to be more precise, the total number of basic two-input Boolean operations (AND, OR, NOT) that can be implemented by a single machine instruction.

A measure of the number of basic Boolean operations is the total number of literals in the factored form in the circuit (see: R. Brayton, R. Rudell, A. Sangiovanni-Vincentelli, and A. Wang, "MIS: A multiple-level logic optimization system" in *IEEE Transactions on CAD*, volume C-6, pages 1062–1081, November 1987; incorporated by reference for its useful background information).

In the absence of feedback, it has been proposed to simulate a number of vectors in parallel by taking advantage of the multiple bits per word on modern computers (see: Z. Barzilai, J. L. Carter, B. K. Rosen, and J. D. Rutledge, "HSS—A High Speed Simulator" in *IEEE Transactions on Computer-Aided Design*, volume C-6, pages 601–617, July 1987; incorporated by reference herein for its useful background information).

Finally, since the binary being executed is free of all branch statements, this results in very good exploitation of the deep CPU pipelines and instruction pre-fetching that is common in CPUs today. Nevertheless, there exists a problem in that LCC simulation, even though faster than event-driven simulation, still takes too long. Ways to speed up LCC simulation must be found so that the overall design cycle can itself be shortened.

SUMMARY OF THE INVENTION

It is the primary object of this invention to overcome the above-identified deficiency of LCC simulation by speeding it up. The invention thus is a novel technique for simulating delay-independent (i.e. purely functional) cycle-based logic simulation of synchronous digital circuits. In particular, the invention is embodied in a faster LCC simulation method. In addition, the invention may be embodied in a computer program product or a computer system. In all of the embodiments, the invention involve determining the output sequence produced by a circuit for a sequence of input vectors, independent of the delays associated with the gates and wires; and determining the output vector for each input vector by evaluating the Boolean equations associated with each gate in the circuit. Feedback is provided. Evaluation for the next input vector occurs only after the evaluation for the current input vector is complete. In other words, the invention features cycle-based sequential simulation in a substantially faster manner than previously has been achieved.

The substantial enhancements to LCC simulation speed are made possible by:

the use of sweep, eliminate and factor to reduce number of literals;
use of cofactoring for speeding up simulation;
register allocation and spill scheme;
inverter minimization scheme;
shift minimization scheme; and
retiming for simulation speed—for compiled code simulation in general.

All these techniques, except the shift minimization scheme, which is for only 4-valued simulation, apply to both 2- and 4-valued simulation.

BRIEF DESCRIPTION OF THE DRAWING FIGURES

FIG. 1(*a*) and FIG. 1(*b*) show basic strategies of event-driven and levelized compiled-code simulation.

DETAILED DESCRIPTION OF THE PREFERRED EMBODIMENTS

There is now described a method for cycle-based simulation using Levelized Compiled Code techniques. Code size and simulation time are determined by both the number of two-input Boolean operations in the netlist and the number of memory accesses required during the simulation. Both are targeted for minimization. Three major steps are involved in the code generation:

Netlist Optimization and Transformation;
Netlist Levelization; and
Assembly Code Generation.

Netlist Optimization

In this step, one has to trade off between the number of basic two-operand Boolean operations that the netlist can be decomposed into and the time consumed in the optimization. The number of literals in a netlist is the count of the total number of occurrences, in the positive or negative phase, of logic variables in the gates of the netlist. The number of two-operand operations in the netlist is closely related to the number of literals. Logic synthesis programs like MISII have readily available routines for literal reduction. The use of the following three optimizations represents a reasonable compromise in terms of getting large reductions in the literal count without spending excessive amounts of CPU time and without compromising the ability to handle large netlists.

sweep: This function rids the netlist of single input gates (inverters and buffers) and also gates that have no fanout. This is a simple function that makes a small number of passes through the netlist. Each gate of the netlist is visited exactly once in each pass.

eliminate: This function rids the netlist of gates whose presence increases the number of literals, i.e., collapsing these gates into their immediate fanouts reduces the number of literals. Before collapsing a gate into its fanout, the function estimates the size of the new onset. If the estimated size is greater than a preset limit, the collapse is not performed. The presence of this check makes eliminate very fast even on large netlists. Most of the literal count reduction is through eliminate.

factor: As a result of the collapses in eliminate, gates in the netlist can become large even though the total number of literals is reduced. A factored-form representation for such large gates is more efficient in terms of the number of literals than a sum-of-products representation. The factored-form representation reduces the number of literals by extracting common subexpressions local to the gate. In fact, it is beneficial to precede the factor operation by the eliminate operation in order to increase the possibility of finding common subexpressions.

For the interested reader, more detailed descriptions of the factor and eliminate operations (although not in the context of this invention) may be found in the following textbook which is incorporated herein by reference: *Logic Synthesis and Verification Algorithms*, by Gary D. Hachtel and Fabio Somenzi, Kluwer Academic Publishers, Norwell Mass., 1996 (see chapter 10).

Figure 2:
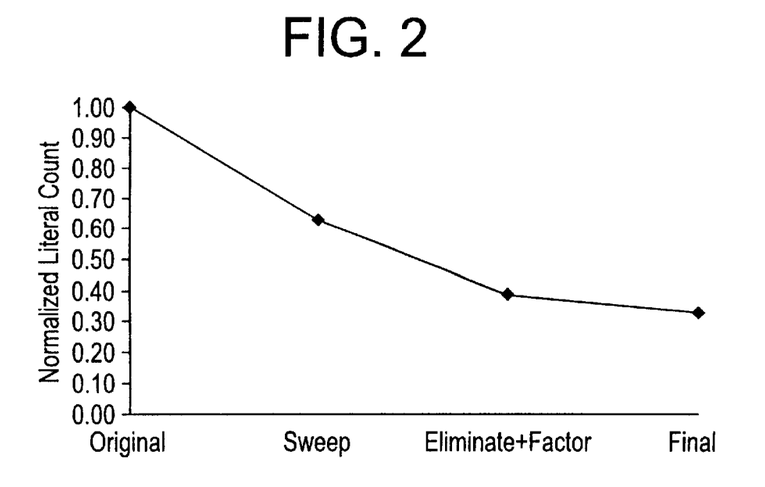
FIG. 2 shows the literal count reduction using sweep and using eliminate+factor.

FIG. 2 shows the normalized cumulative reduction averaged over the largest seven examples from the ISCAS89 benchmark suite, in the number of literals by the application of sweep, eliminate and factor. In addition, it also shows further reduction in the number of literals by the application of the complete suite of algorithms available in MISII. The table indicates that most of the reduction in literal count is obtained by sweep, eliminate and factor. The subsequent steps are much more time consuming and reduce the number of literals by Much smaller amounts.

Netlist Transformation by Cofactoring

This is a key contribution which enables significant speed up over conventional LCC generation methods. Generally, there are a number of primary inputs in the circuit with extremely large fanout. Assigning such signals to constants and propagating the constants through the circuit reduces the number of literals in the resulting circuit by multiple factors. Propagating a constant through a gate is a simple step in which the function of the gate is modified to reflect that one or more of its inputs are constants. For example, if any input of an AND gate is a constant 0, the AND gate itself becomes a constant 0 function. On the other hand, if one of the inputs of a two input AND gate is a constant 1, the AND gate changes into a wire physically connected to the other input. When some primary inputs are constants, the effect is propagated through the circuit until no more changes are possible. Assigning a primary input to a constant and propagating its effect through the circuit is called cofactoring the circuit with respect to that input.

By cofactoring the circuit with selected inputs, there is provided a significant reduction in the number of literals, and hence the simulation time. Thus, the preferred method of speeding up LCC involves:

selecting a small number of inputs for cofactoring;

determining the corresponding cofactored circuit for each combination of values on the selected inputs by propagating the input values corresponding to the combination;

generating code separately for each of these cofactored circuits; and during simulation, simulating only the one of the above cofactored circuits during each cycle depending on the value of the inputs selected for cofactoring.

Since the number of selected inputs is small, negligible time is required to check the combination of values on the selected inputs. If $r_i$ is the reduction in the number of literals for the circuit cofactored with the value i on the input combinations, and $n_i$ is the number of times the inputs take that combination, the total reduction in the simulation time is given by $\Sigma r_i n_i$ over all the combinations of the selected inputs. If ri is 50% on the average, there is realized a 2× reduction the simulation speed.

This method can be used for 2 and 4-valued simulation except that in the case of 4-valued simulation, the X and Z values are not propagated. If any input has an X or Z value, the original (uncofactored) circuit is simulated. The invention may thus be understood to be a method to reduce the average size of the simulated circuit.

Levelization

In the most basic form, this step does a single depth-first search of the netlist returning an array of gates with the property that a gate occurs in the array only after all gates in its fanin. This array represents a valid order in which the gates can be evaluated. This is not necessarily the best order in terms of the number of memory accesses required during simulation since it does not try to address the problem of memory spills. In order to minimize memory spills, the value computed at the output of a gate must be consumed as soon as possible and discarded. A cost function that tries to minimize some function of the distances between a gate and its fanouts is required. Since finding an optimal order under such a cost function is practically infeasible, the gates are ordered using a simple depth-first search.

Code Generation for Two Valued Simulation

This step converts the optimized netlist to assembly code. SPARC assembly language is used to explain the techniques. The same techniques apply to other processor architectures as well. It is important that the assembly code be generated directly from the netlist since compiling C code generated for even a moderately sized circuit with about 10K gates can take an inordinately long time. For some useful background on SPARC, see the following book (which is incorporated herein by reference):

R. P. Paul. SPARC architecture, assembly language, programming, &C. Prentice Hall, 1994.

Basic Approach

The basic approach begins with premise that one byte is to be used per variable. This decision was prompted by a number of factors. Among them: (1) Current generation processors only provide word, half-word and byte level addressing. As a result, packing multiple variables into a single bit necessitates an unpack and repack step whenever the packed variables cannot be used together. In practice, this can be expected to happen every Boolean operation. (2) The number of input variables, output variables and internal variables required at any given time is small enough even for the largest circuits that the total memory requirement for storing the variables is not an issue. This is especially true given the main memory and cache sizes available today. (3) One byte per variable has the positive side effect that the storage for multiple-valued simulation can be made compatible with two-valued simulation. This is ensured, for example, in four-valued simulation by choosing the values "00" and "01" to represent "0" and "1", respectively.

The memory map of variables is a contiguous array of bytes. Each input and output variable of the netlist is associated with an index that maps the variable to its location in the memory map. A portion of the memory map is reserved for temporary variables. The code-generator dynamically assigns bytes from the temporary portion of the memory map to temporary variables as they are created. Once a temporary variable has passed its life time, its byte can be reassigned to another variable.

In SPARC assembly code, two instructions are required to load a 32 bit immediate word into a register. In order to avoid the two-instruction penalty each time a variable is to be loaded from memory, the base addresses of the permanent and temporary portions of the memory map are stored in dedicated registers at the beginning of the assembly code. A variable value can then be fetched in a single instruction by means of an ldub%r1, imm_off, %r2, where %r1 is the register storing the base address, imm_off corresponds to the array index of the variable being fetched and %r2 is the register into which the value is loaded. SPARC allows a signed immediate offset between −4096 and +4095. To maximize the number of variables that can be referenced by a single reference register, base address+4096 is stored rather than the actual base address. This way, each reference register can be used for 8192 variables. If the number of variables exceeds 8192, more than one reference registers must be used.

Minimizing Memory Requirement and Register Spills

The life time of a variable is defined as the time between its first and last references. A primary input variable must be fetched at least once from memory into a register. It may have to be fetched multiple times if the register into which it is fetched is spilled during its life time. A primary output variable is stored to memory from register once. A temporary variable (internal variable in the netlist), on the other hand, is created into a register and must be stored to memory and fetched back later on only if its register is spilled. The code generator must perform the following tasks:

Allocate registers and determine when a spill is required. The code generator maintains a free list of available registers. A spill is required when this list is empty.

Determine which variable must be spilled. This is achieved by maintaining a spill list consisting of all the variables that currently reside in registers. The variables in the spill list are ordered in the order of decreasing distance in the statically obtained schedule of gate evaluations to the next reference of the variable. If a spill is required, the variable at the head of the list is picked for spilling. Other criteria like variable life time can also be used to order the variables in the spill list. If the variable being spilled is an internal variable being spilled for the first time, its value must be saved in memory. Otherwise, the only thing that needs to be done is to add the register to the free list of registers, and nothing needs to be done during the actual simulation to spill the variable.

Allocate byte from temporary memory map for next internal variable to be spilled. When a variable is discarded, the byte associated with the variable can be reused the next time a temporary variable is spilled for the first time. The code generator maintains a free list of the available bytes from the temporary memory map. The next byte used is the last byte that was freed. This LIFO reuse strategy has the advantage of minimizing the total memory required for the temporary variables and also of minimizing cache misses during the simulation.

Find the order in which the inputs of an AND gate must be ANDed (OR gate must be ORed) so that the number of spills is minimized. The order is the following: (1) Fanins in register with one remaining reference (the gate being evaluated). (2) If a spill is required then the one fanin that is the next variable to be spilled, if there is such a fanin. (3) A fanin that is in memory and has only one remaining reference. (4) All fanins that are in register. (5) All fanins in memory that have one remaining reference. (6) All fanins in memory.

Determine if a variable can be discarded. If it can, discard it. A variable can be discarded if it has no more remaining references. This is easily determined by the code generator from the fanout data structure of the gate.

Figure 3:
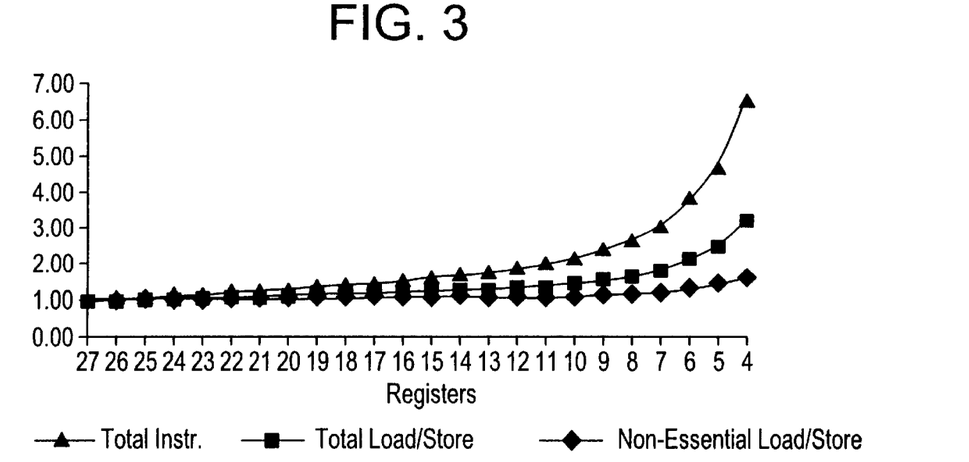
FIG. 3 shows spill statistics versus the number of registers.

As the number of variables increases, more registers are required for storing the base addresses. Consequently, fewer registers are available for storing variable values and the number of spills (non-essential loads and stores) increases. FIG. 3 shows the average normalized increase in the instruction count, total number of loads and stores, and the number of non-essential loads and stores for the large ISCAS89 examples s38417 and s38584. As the number of available registers goes down from 27 to 15, the increase can be seen to be quite small. This means that even if 12 registers (corresponding to more than 96000 input/output variables) are dedicated to storing base addresses, the performance degradation will be very small (about 26% for these two examples).

Figure 4:
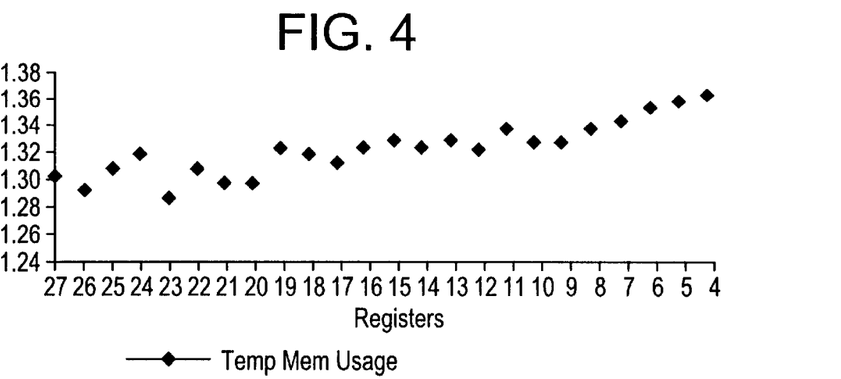
FIG. 4 shows temporary storage required as a percentage of the number of internal variables.

Another point to note is that amount of temporary storage required to store spilled internal variables is quite small compared to the number of internal variables. A percentage ratio of the peak temporary storage required to the total number of internal variables as a function IS of the number of registers is plotted in FIG. 4. Again this is an average over the two large examples s38417 and s38584. It can be seen that even with only 4 registers available, the number of bytes of temporary storage required is less than 1.5% of the number of internal variables.

Figure 5:
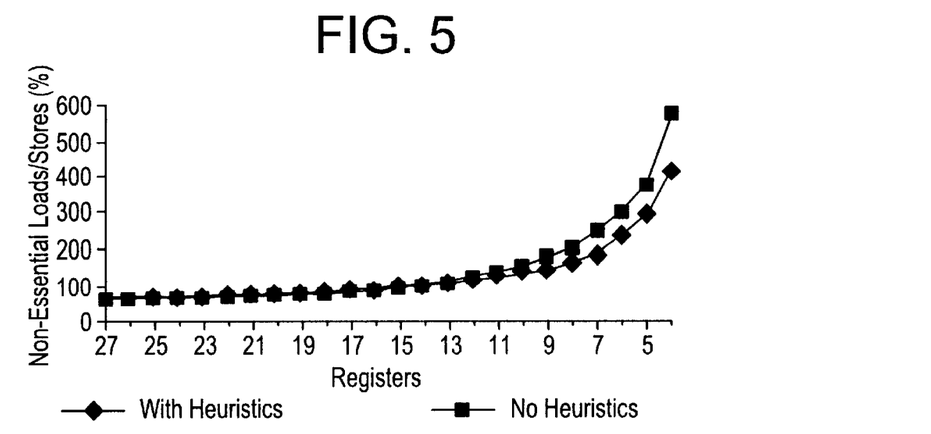
FIG. 5 shows the usefulness of the spill minimization heuristics.

To demonstrate that the spill minimization heuristics are indeed useful, the plot of the number of non-essential loads/stores expressed as a percent of the number of essential loads/stores versus the number of available registers when the heuristics are not in use is compared with the same plot when the heuristics are in use in FIG. 5. It can be observed that when the number of available registers decreases, the number of loads/stores rises significantly faster when the heuristics are not in use. This can be construed to imply that for very large examples in which the number of input output variables is large and therefore the number of registers available to store variable values is small, the heuristics will indeed play a role in minimizing the number of spills.

Inverter Minimization

An inversion is required whenever the phase in which a signal is stored is the opposite of the phase in which it is required to be used. A inversion represents a one instruction overhead at run time. In practice, a large fraction of wires must be inverted at some time, making the inversion overhead significant. This overhead is minimized on the SPARC in the following manner: There are four inversion possibilities when a two input Boolean AND (OR) is to be evaluated corresponding to an inversion being required on none, one or both the inputs. When no inversion is required, there is obviously no overhead. When one inversion is required, the SPARC ANDN (ORN) instruction that computes a.b' (a+b'), where a and b are the two inputs, is exploited. Again there is no overhead. When both inputs need to be inverted, DeMorgan's law is used to compute the output in the inverted phase rather than invert one of the inputs to compute the output in its correct phase. For example, instead of evaluating c=(a.b)', the method of the invention it to evaluate c'=a+b. The phase of the output is stored away so that when the output is referenced later on, it can be used correctly. This approach ensures that actual inversions are required only at primary outputs, and that the number of inversions is bounded by the number of primary outputs. Since a large number of inversions is likely to "die" out before reaching an output, the actual number of inversions can be expected to be much less than the number of outputs. Note that the phase in which a signal is stored in memory need not be the same as the phase in which it is stored in register. It is sufficient to ensure that the phase of the register version of the signal is correctly recognized when the variable is fetched from memory, and the correct phase is stored when the register is spilled to memory.

Figure 6:
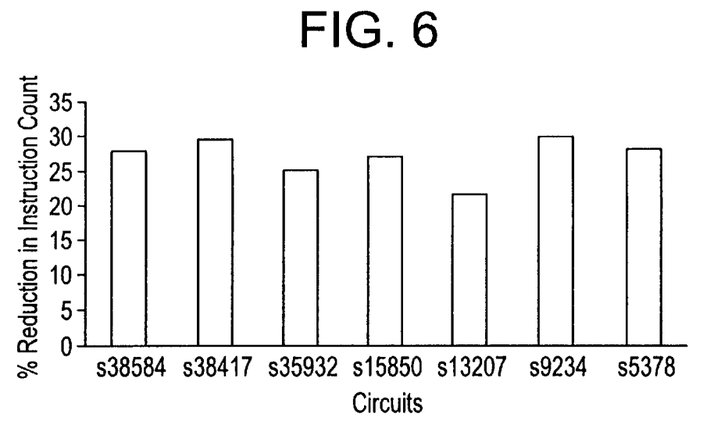
FIG. 6 shows the usefulness of the inverter minimization heuristics.

The increase in the number of instructions when the inverter minimization heuristics are not in use is plotted in FIG. 6 for a number of ISCAS89 benchmarks. It can be seen that the total instruction count reduces by more than 20% in all cases. This reduction is not accompanied by an increase in the number of loads/stores, and therefore translates directly into a reduction in run time.

Code Generation Example

Two-valued simulation code generated for the logic equations f=a'·b·c'·d is shown below:

```
.global  _lcc
_lcc:
         save   %sp,-64, %sp
         sethi  %hi (_g+4096) , %i5
         or     %i5,%lo(_g) , %i5        set up memory map address in %i5
         ldub   [%i5+(-4096)], %i4       load variable "a"into %i4
         ldub   [%i5+(-4095)], %i3       load variable "b"into %i3
         andn   %i3, %i4, %i4            %i4 = a' b
         ldub   [%i5+(-4094)], %i3       load variable "c"into %i3
         andn   %i4, %i3, %i4            %i4 = %i4 c'
         ldub   [%i5+(-4093)], %i3       load variable "d"into %i3
         and    %i4, %i3, %i4            %i4 = %i4 d
         and    %i4, 1, %i4
         stb    %i4, [%i5+(-4092)]       store output "f"
LE27:
         ret
         restore
```

Code Generation for Multiple-Valued Simulation

Code generation for multiple-valued simulation proceeds in exactly the same manner as for two-valued simulation except for the actual instructions emitted to evaluate logic operations. The techniques for four-valued simulation will be discussed. The same techniques apply when simulating more than four values also.

As discussed earlier, logic "0" and logic "1" are mapped to "00" and "01" in the four-valued case to keep it compatible with two-valued simulation. "X" (unknown value) maps, to "10" and "Z" (high impedance value) maps to "11". Computation of a logic function is implemented as a table look up. As in the two-valued case, inversion is supported, two-input AND and OR, and two-input AND and OR with one input inverted. That corresponds to five tables. The tables are indexed by the signal values, and each two-dimensional table is stored as a single array in row major form. The tables for the five supported operations are the following:

$$MV\_AND\_TABLE[16] = \{0, 0, 0, 0, 0, 1, X, Z, 0, X, X, Z, 0, Z, Z, Z\}$$

$$MV\_ANDN\_TABLE[16] = \{0, 0, 0, 0, 1, 0, X, Z, X, 0, X, Z, Z, 0, Z, Z\}$$

$$MV\_OR\_TABLE[16] = \{0, 1, X, Z, 1, 1, 1, 1, X, 1, X, Z, Z, 1, Z, Z\}$$

$$MV\_ORN\_TABLE[16] = \{1, 0, X, Z, 1, 1, 1, 1, 1, X, X, Z, 1, Z, Z, Z\}$$

$$MV\_NOT\_TABLE[4] = \{1, 0, X, Z\}$$

Since it would take two instructions to load a 32 bit immediate address corresponding to the head of a table into a register, the top addresses of the five tables are stored in five dedicated registers. A look up for a NOT gate can then be performed in a single instruction. A lookup for a two-input operation requires three instruction consisting of a left shift by 2 of the register containing the row variable, OR of the result with the column variable and then the actual look up. This means that on the average, three instructions per Boolean operation can be expected in four-valued simulation compared to one instruction per operation in the two-valued case.

Code Generation Example

Four-valued simulation code generated for the logic equations f=a'·b·c'·d is shown below:

```
.global   _lcc
_lcc:
       save   %sp, -64, %sp
set up memory map address in %i5
       sethi  %hi (_g+4096) , %i5
       or     %i5, %10(_g) , %i5
set up lookup tables in registers %i4–%i1
       sethi  %hi (_MV_AND_TABLE) , %i4
       or     %i4, %lo (_MV_AND_TABLE) , %i4
       sethi  %hi (_MV_ANDN_TABLE) , %i3
       or     %i3,%lo (_MV_ANDN_TABLE) , %i3
       sethi  %hi (_MV_OR_TABLE) , %i2
       or     %i2, %lo (_MV_OR_TABLE) , %i2
       sethi  %hi (_MV_ORN_TABLE) , %i1
       or     %i1, %lo (_MV_ORN_TABLE) , %i1
       ldub   [%i5+(-4096)],%i0              load variable "a"
       ldub   [%i5+(-4095)],%o5              load variable "b"
compute %i0 = a' b
       sll    %o5, 2, %o5
       or     %o5, %i0, %i0
       ldub   [%i3+%i0],%i0
       ldub   [%i5+(-4094)],%o5              load variable "c"
compute %i0 = %i0 c'
       sll    %i0, 2, %i0
       or     %i0, %o5, %i0
```

-continued

```
1dub    [%i3+%i0], %i0
1dub    [%i5+(-4093)], %o5        load variable "d"
compute %i0 = %i0 d
  sll   %i0, 2, %i0
  or    %i0, %o5, %i0
1dub    [%i4+%i0], %i0
  stb   %i0, [%i5+(-4092)]        store output "f"
LE27:
  ret
  restore
```

Figure 7:
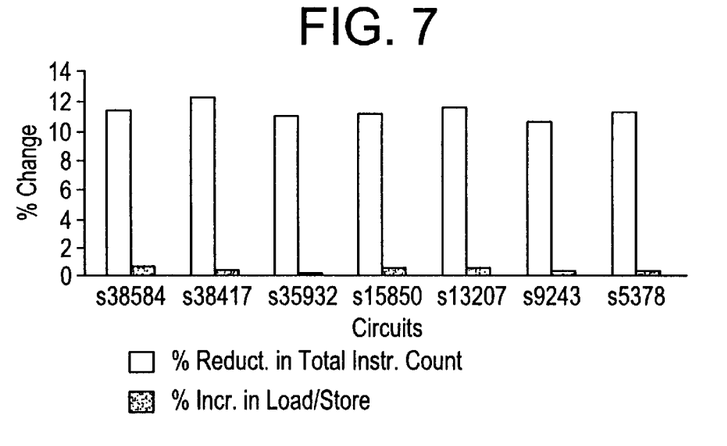
FIG. 7 shows the usefulness of the shift minimization heuristics.

In principle, the number of shifts required in the four-valued simulation can be minimized in the same manner as the number of inversions by keeping track of whether a variable is in the shifted state or not. Unfortunately, a problem would develop with the ANDN and ORN operation if the variable that is shifted is also the variable that must be complemented. This can be avoided by implementing two versions each of ANDN and ORN, one in which the row variable is complemented and another in which the column variable is complemented. Of course, this solution would use up some registers and thereby increase the number of register spills. The total instruction count can be reduced significantly by implementing two versions each of ANDN and ORN. FIG. 7 shows the reduction in instruction count (shift instructions) and the increase in the number of loads/stores for some large ISCAS89 benchmarks when this optimization is used. It can be observed that the total instruction count is reduced by about 10%. Since the additional loads/stores are almost entirely for memory locations that have already been fetched once, these instructions are expected to exhibit good cache behavior. The conclusion is that the reduction in total instruction count does indeed translate to a reduction in run time in spite of the increase in the number of loads and stores.

Since Boolean operations are evaluated as table lookups, it is clear one can augment the set of operations supported with arbitrary two or more input operations. For example, inversions can be completely be done away with by defining NOR and NAND operations. Again, adding new operations uses up registers, thereby increasing the number of register spills. The inventor has noted that the total number of inversions generally is small enough that using up two registers to implement NOR and NAND functions is not justified.

Extension to >4 Values

The same code generation techniques can be used for the simulation of greater than four values. The only difference will be that the tables implementing the various Boolean operations will be larger. The number of instructions of emitted code will be exactly the same even if the number of values simulated increases. But there will be a second order effect on the run time as a result of the increased cache miss penalty in accessing the larger tables. Since the size of the table for a two-operand operation is proportional to the square of the number of values, this effect could in fact be significant.

Comparison with Two-Valued Simulation

Figure 8:
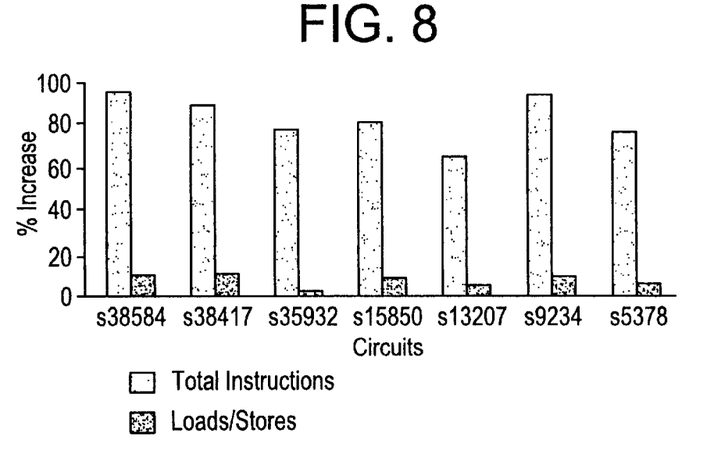
FIG. 8 shows a comparison of code generated for two and four valued simulation.

FIG. 8 shows a plot of the increase in the total instruction count and the number of loads/stores for variables in four-valued simulation over two-valued simulation for a number of large ISCAS89 benchmarks.

C versus Assembly Code

Figure 9:
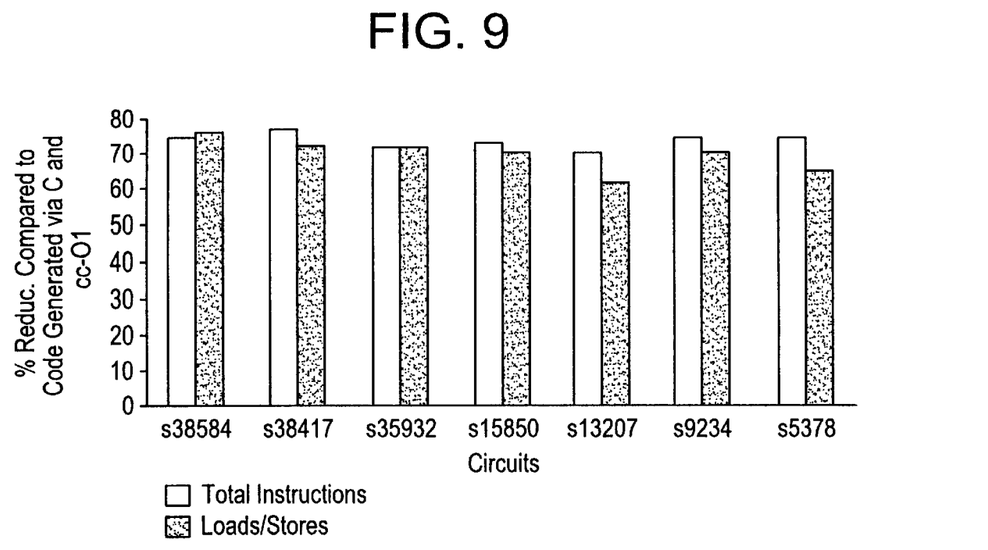
FIG. 9 shows a comparison of direct code generation with the compiler cc and the option -01 for 2-valued LCC.
Figure 10:
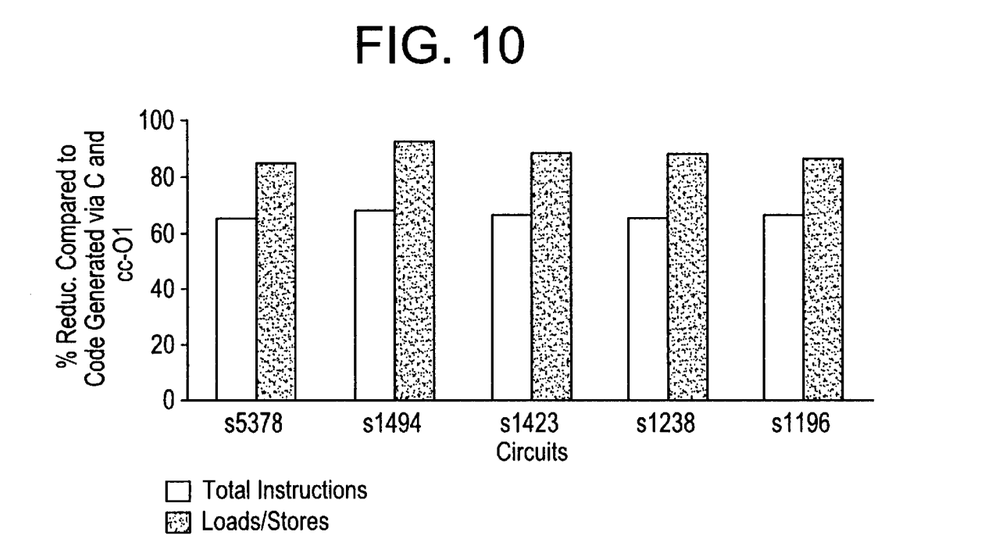
FIG. 10 shows a comparison of direct code generation with the compiler cc and the option -01 for 4-valued LCC.

A number of optimizations suggested above are not available when using a general purpose C compiler like cc or gcc. Consequently, the code generated by the method according to the invention may be expected to be better than the code generated by cc or gcc. This is borne out in FIG. 9 and FIG. 10. The plots of the decrease in the total number of instructions and the number of loads/stores of variables when using the inventive code generator to generate assembly code directly compared to using C and cc –O1 are shown in the two figures. It can be seen that the code produced by direct assembly code generation is overwhelmingly superior to the code generated by cc –O1. For two-valued simulation, the number of instructions and the number of loads/stores are both lower by more than 70% for all the circuits when using direct assembly code generation. For four-valued simulation, only the plots for the smaller circuits are shown since compilation of C code using cc –O1 takes too long for the large circuits. It can be seen that the direct assembly code generated for 4-valued simulation is also superior to the code generated via cc –O1. It should be noted that the inventive code generator is many times faster than cc –O1.

Retiming

There will now be described an embodiment of the invention in which retiming is used to speed up compiled code simulation. Retiming involves moving flip-flops or latches across gates. For example, if each input of a two-input gate has a flip-flop on it, the two flip-flops can be replaced by a flip-flop at the output of the gate. The initial states on the original two flip-flops must be properly mapped to an initial state on the new flip-flop. On the other hand, if a gate has a flip-flop at its output, that flip-flop could be replaced by flip-flops at each of the inputs of the gate, again with proper mapping of the initial states. Reducing the number of flip-flops or latches in the netlist can speed up compiled code simulation in two ways:

a. Each flip-flop or latch includes additional circuitry, for example circuitry to update it correctly when the set/reset signals are active. This additional circuitry must also be evaluated in each cycle during simulation.

b. The speed of some compiled code simulation techniques is dependent on the number of inputs and outputs of the circuit including the number of flip-flop or latch inputs and outputs (see: P. Ashar and S. Malik, "Fast Functional Simulation Using Branching Programs" in *Proceedings of the International Conference on Computer-Aided Design,* pages 408–412, November 1995; incorporated by reference). By reducing the number of flip-flops or latches, the number of inputs and outputs is reduced directly, hence speeding up the simulation.

Retiming algorithms for reducing the number of flip-flops or latches have been proposed in the past (for a recent algorithm, refer to: N. Shenoy and R. Rudell, "Efficient Implementation of Retiming" in *Proceedings of the International Conference on Computer-Aided Design,* pages 226–233, November 1994; incorporated by reference). Any of these algorithms can be used for the purposes of the invention. Retiming also changes the clock-period of the circuit. But since the clock period is of no interest during the simulation, it is legal to use retiming to speed up simulation. In fact, since most circuits are optimized for speed (minimum clock period), they usually have a very large number of flip-flops or latches. That means that there is a large potential for speeding up simulation by this method.

CONCLUSION

The invention provides a method for speeding up levelized compiled-code simulation. Among the significant advances of the invention toward speeding up simulation speed are the following:

the use of sweep, eliminate and factor to reduce number of literals;
use of cofactoring for speeding up simulation;
register allocation and spill scheme;
inverter minimization scheme;
shift minimization scheme; and
retiming for simulation speed—for compiled code simulation in general.

All these techniques except the shift minimization scheme, which is for only 4-valued simulation, apply to both 2- and 4-valued simulation.

The invention thus is embodied in a method of performing LCC simulation. However, the LCC simulation method according to the invention may also be implemented in other ways. For example, it may be implemented in a computer system. That is, a computer system embodying the invention will contain hardware and software enabling it to perform a LCC simulation according to the invention described herein.

Similarly, the above-identified invention may be embodied in a computer program product, as will now be explained.

On a practical level, the software that enables the computer system to perform the above-identified inventive method is supplied on any one of a variety of media. Furthermore, the actual implementation of the approach and operations of the invention may actually be statements written in a programming language. Such programming language statements, when executed by a computer, cause the computer to act in accordance with the particular content of the statements. Furthermore, the software that enables a computer system to act in accordance with the invention may be provided in any number of forms including, but not limited to, original source code, assembly code, object code, machine language, compressed or encrypted versions of the foregoing, combinations thereof, and any and all equivalents.

One of skill in the art will appreciate that "media", or "computer-readable media", as used here, may include a diskette, a tape, a compact disc, an integrated circuit, a cartridge, a remote transmission via a communications circuit, or any other similar medium useable by computers. For example, to supply software for enabling a computer system to operate in accordance with the invention, the supplier might provide a diskette or might transmit the software in some form via satellite transmission, via a direct telephone link, or via the Internet.

Although the enabling software might be "written on" a diskette, "stored in" an integrated circuit, or "carried over" a communications circuit, it will be appreciated that, for the purposes of this application, the computer usable medium will be referred to as "bearing" the software. Thus, the term "bearing" is intended to encompass the above and all equivalent ways in which software is associated with a computer usable medium.

For the sake of simplicity, therefore, the term "program product" is thus used to refer to a computer useable medium, as defined above, which bears in any form of software to enable a computer system to operate according to the above-identified invention. Thus, the invention is also embodied in a program product bearing software which enables a computer to perform the above-described LCC simulation method according to the invention.

I claim:

1. A method of simulating delay-independent functions of an input netlist of Boolean logic gates of a synchronous digital circuit in response to a sequence of input vectors, said gates each having a respective gate fanin of one or more inputs and a respective gate fanout of zero or more outputs, said inputs and said outputs of all said gates defining literals of said netlist, the method comprising:

optimizing said input netlist;
levelizing said optimized netlist;
representing each of said gates of said levelized netlist in software programming statements; and
executing a computer program, derived from said software programming statements, with said sequence of input vectors as input, to provide for each of said input vectors a corresponding output vector;
whereby said output vector represents said delay-independent functions of said input netlist; and
wherein said optimizing comprises:
eliminating ones of said gates which have, as said respective gate fanin, only one input;
eliminating ones of said gates which have, as said respective gate fanout, zero outputs;
collapsing ones of said gates, onto said respective gate fanout, when said collapsing reduces an overall number of said literals of said netlist; and
factoring selected ones of said gates from a sum-of-products form to a factored form.

2. The method of simulating as set forth in claim 1, wherein said step of representing said gates in software programming statements comprises generating assembly code directly from said optimized netlist, said generating of assembly code being for a computer system having a set of registers and a memory, said literals being stored with a given respective phase, said generating including:

for each of said gates having two of said inputs, when only one inversion of said phase is indicated, using an ANDN assembly language instruction; and
for each of said gates having two of said inputs, when inversion of both of said two inputs is indicated, computing said respective output in an inverted phase and recording the phase of said respective output.

3. The method of simulating as set forth in claim 1, wherein:

said simulation is four-valued simulation; and
said step of representing said gates in software programming statements comprises generating assembly code directly from said optimized netlist, said generating of assembly code being for a computer system having a set of registers and a memory, said generating including implementing two versions of an ANDN operation and two versions of an ORN operation, each of said two versions including one version in which a row variable is complemented and another version in which a column variable is complemented.

4. The method of simulating as set forth in claim 1, wherein said digital circuit has devices including one or more of flip-flops and latches, and said optimizing of said input netlist comprises reducing a number of said devices by retiming said netlist according to a retiming algorithm.

5. A method of simulating delay-independent functions of an input netlist of Boolean logic gates of a synchronous digital circuit in response to a sequence of input vectors, said gates each having a respective gate fanin of one or more inputs and a respective gate fanout of zero or more outputs, said inputs and said outputs of all said gates defining literals of said netlist, the method comprising:

optimizing said input netlist;

levelizing said optimized netlist;

determining cofactored netlists by propagating, through said optimized netlist, constant values assigned to said one or more of said selected inputs, each of said cofactored netlists corresponding to said propagated constant values;

selecting one or more of said inputs for cofactoring, representing each of said gates of said levelized netlist in software programming statements; and executing a computer program, derived from said software programming statements, with said sequence of input vectors as input, to provide for each of said input vectors a corresponding output vector;

whereby said output vector represents said delay-independent functions of said input netlist;

said step of representing said gates including generating sets of software programming statements, each corresponding to one of said cofactored netlists; and said step of executing said computer program including:
determining, for each of said input vectors, present constant values for said one or more selected inputs;
selecting, based on said present constant values and said propagated constant values, one of said cofactored netlists for execution; and
executing a portion of said computer program derived from one of said sets of software programming statements corresponding to said selected one of said cofactored netlists.

6. The method of simulating as set forth in claim 5, wherein said step of representing said gates in software programming statements comprises generating assembly code directly from said optimized netlist, said generating of assembly code being for a computer system having a set of registers and a memory, said literals being stored with a given respective phase, said generating including:

for each of said gates having two of said inputs, when only one inversion of said phase is indicated, using an ANDN assembly language instruction; and for each of said gates having two of said inputs, when inversion of both of said two inputs is indicated, computing said respective output in an inverted phase and recording the phase of said respective output.

7. The method of simulating as set forth in claim 5, wherein:

said simulation is four-valued simulation; and said step of representing said gates in software programming statements comprises generating assembly code directly from said optimized netlist, said generating of assembly code being for a computer system having a set of registers and a memory, said generating including implementing two versions of an ANDN operation and two versions of an ORN operation, each of said two versions including one version in which a row variable is complemented and another version in which a column variable is complemented.

8. The method of simulating as set forth in claim 5, wherein said digital circuit has devices including one or more of flip-flops and latches, and said optimizing of said input netlist comprises reducing a number of said devices by retiming said netlist according to a retiming algorithm.

9. A method of simulating delay-independent functions of an input netlist of Boolean logic gates of a synchronous digital circuit in response to a sequence of input vectors, said gates each having a respective gate fanin of one or more inputs and a respective gate fanout of zero or more outputs, said inputs and said outputs of all said gates defining literals of said netlist, the method comprising:

optimizing said input netlist;

levelizing said optimized netlist;

representing each of said gates of said levelized netlist in software programming statements; and executing a computer program, derived from said software programming statements, with said sequence of input vectors as input, to provide for each of said input vectors a corresponding output vector;

whereby said output vector represents said delay-independent functions of said input netlist; and wherein said step of representing said gates in software programming statements comprises generating assembly code directly from said optimized netlist, said generating of assembly code being for a computer system having a set of registers and a memory, said generating including:

maintaining an ordered spill list indicating ones of said literals presently residing in one of said set of registers;

determining when a spill is required from one of said set of registers; and setting an execution order for logical Boolean operations on said one or more inputs of each of said gates so that said operations involve inputs in the following order:

(1) inputs with corresponding values residing in said set of registers with only one remaining reference in said netlist; then (2) an input identified in said ordered spill list as a next input to be spilled; then (3) inputs with corresponding values residing in said memory with only one remaining reference in said netlist; then (4) inputs with corresponding values residing in said set of registers; then (5) all inputs with corresponding values residing in said memory with only one remaining reference in said netlist; and then (6) all inputs with corresponding values residing in said memory.

10. The method of simulating as set forth in claim 9, wherein said step of representing said gates in software programming statements comprises generating assembly code directly from said optimized netlist, said generating of assembly code being for a computer system having a set of registers and a memory, said literals being stored with a given respective phase, said generating including:

for each of said gates having two of said inputs, when only one inversion of said phase is indicated, using an ANDN assembly language instruction; and for each of said gates having two of said inputs, when inversion of both of said two inputs is indicated, computing said respective output in an inverted phase and recording the phase of said respective output.

11. The method of simulating as set forth in claim 9, wherein:

said simulation is four-valued simulation; and said step of representing said gates in software programming statements comprises generating assembly code directly from said optimized netlist, said generating of assembly code being for a computer system having a set of registers and a memory, said generating including implementing two versions of an ANDN operation and two versions of an ORN operation, each of said two versions including one version in which a row variable is complemented and another version in which a column variable is complemented.

12. The method of simulating as set forth in claim 9, wherein said digital circuit has devices including one or more of flip-flops and latches, and said optimizing of said input netlist comprises reducing a number of said devices by retiming said netlist according to a retiming algorithm.

13. A computer program product for enabling a computer to simulate delay-independent functions of an input netlist of Boolean logic gates of a synchronous digital circuit in response to a sequence of input vectors, said gates each having a respective gate fanin of one or more inputs and a respective gate fanout of zero or more outputs, said inputs and said outputs of all said gates defining literals of said netlist, said computer program product comprising:

software instructions for enabling the computer to perform predetermined operations, and a computer readable medium bearing the software instructions;

the predetermined operations including the steps of:
optimizing said input netlist, including:
eliminating ones of said gates which have, as said respective gate fanin, only one input;
eliminating ones of said gates which have, as said respective gate fanout, zero outputs;
collapsing ones of said gates, onto said respective gate fanout, when said collapsing reduces an overall number of said literals of said netlist; and
factoring selected ones of said gates from a sum-of-products form to a factored form;
levelizing said optimized netlist;
representing each of said gates of said levelized netlist in software programming statements; and
simulating said delay-independent functions of an input netlist by executing a computer program, derived from said software programming statements, with said sequence of input vectors as input, to provide for each of said input vectors a corresponding output vector, whereby said output vector represents said delay-independent functions of said input netlist.

14. The computer program product as set forth in claim 13, wherein said software instructions further enable said computer to perform said predetermined operations so that said step of representing said gates in software programming statements comprises generating assembly code directly from said optimized netlist, said generating of assembly code being for a computer system having a set of registers and a memory, said literals being stored with a given respective phase, said generating including:

for each of said gates having two of said inputs, when only one inversion of said phase is indicated, using an ANDN assembly language instruction; and for each of said gates having two of said inputs, when inversion of both of said two inputs is indicated, computing said respective output in an inverted phase and recording the phase of said respective output.

15. The computer program product as set forth in claim 13, wherein said software instructions further enable said computer to perform said predetermined operations so that:
said simulation is four-valued simulation; and
said representing said gates in software programming statements comprises generating assembly code directly from said optimized netlist, said generating of assembly code being for a computer system having a set of registers and a memory, said generating including implementing two versions of an ANDN operation and two versions of an ORN operation, each of said two versions including one version in which a row variable is complemented and another version in which a column variable is complemented.

16. The computer program product as set forth in claim 13, wherein said software instructions further enable said computer to perform said predetermined operations so that, when said digital circuit has devices including one or more of flip-flops and latches, said optimizing of said input netlist comprises reducing a number of said devices by retiming said netlist according to a retiming algorithm.

17. A computer program product for enabling a computer to simulate delay-independent functions of an input netlist of Boolean logic gates of a synchronous digital circuit in response to a sequence of input vectors, said gates each having a respective gate fanin of one or more inputs and a respective gate fanout of zero or more outputs, said inputs and said outputs of all said gates defining literals of said netlist, said computer program product comprising:

software instructions for enabling the computer to perform predetermined operations, and a computer readable medium bearing the software instructions;

the predetermined operations including the steps of:
optimizing said input netlist;
levelizing said optimized netlist;
representing each of said gates of said levelized netlist in software programming statements; executing a computer program, derived from said software programming statements, with said sequence of input vectors as input, to provide for each of said input vectors a corresponding output vector; and whereby said output vector represents said delay-independent functions of said input netlist;

wherein said software instructions further enable said computer to perform said predetermined operations including:
selecting one or more of said inputs for cofactoring, and
determining cofactored netlists by propagating, through said optimized netlist, constant values assigned to said one or more of said selected inputs, each of said cofactored netlists corresponding to said propagated constant values;

said representing said gates including generating sets of software programming statements, each corresponding to one of said cofactored netlists;

said executing said computer program comprising:
determining, for each of said input vectors, present constant values for said one or more selected inputs;
selecting, based on said present constant values and said propagated constant values, one of said cofactored netlists for execution; and
executing a portion of said computer program derived from one of said sets of software programming statements corresponding to said selected one of said cofactored netlists.

18. The computer program product as set forth in claim 17, wherein said software instructions further enable said computer to perform said predetermined operations so that said step of representing said gates in software programming statements comprises generating assembly code directly from said optimized netlist, said generating of assembly code being for a computer system having a set of registers and a memory, said literals being stored with a given respective phase, said generating including:
  for each of said gates having two of said inputs, when only one inversion of said phase is indicated, using an ANDN assembly language instruction; and
  for each of said gates having two of said inputs, when inversion of both of said two inputs is indicated, computing said respective output in an inverted phase and recording the phase of said respective output.

19. The computer program product as set forth in claim 17, wherein said software instructions further enable said computer to perform said predetermined operations so that:
  said simulation is four-valued simulation; and
  said representing said gates in software programming statements comprises generating assembly code directly from said optimized netlist, said generating of assembly code being for a computer system having a set of registers and a memory, said genera ting including implementing two versions of an ANDN operation and two versions of an ORN operation, each of said two versions including one version in which a row variable is complemented and another version in which a column variable is complemented.

20. The computer program product as set forth in claim 17, wherein said software instructions further enable said computer to perform said predetermined operations so that, when said digital circuit has devices including one or more of flip-flops and latches, said optimizing of said input netlist comprises reducing a number of said devices by retiming said netlist according to a retiming algorithm.

21. A computer program product for enabling a computer to simulate delay-independent functions of an input netlist of Boolean logic gates of a synchronous digital circuit in response to a sequence of input vectors, said gates each having a respective gate fanin of one or more inputs and a respective gate fanout of zero or more outputs, said inputs and said outputs of all said gates defining literals of said netlist, said computer program product comprising:
  software instructions for enabling the computer to perform predetermined operations, and
  a computer readable medium bearing the software instructions;
  the predetermined operations including the steps of:
    optimizing said input netlist;
    levelizing said optimized netlist;
    representing each of said gates of said levelized netlist in software programming statements; and
    executing a computer program, derived from said software programming statements, with said sequence of input vectors as input, to provide for each of said input vectors a corresponding output vector;
    whereby said output vector represents said delay-independent functions of said input netlist; and
    wherein said software instructions further enable said computer to perform said predetermined operations so that said step of representing said gates in software programming statements comprises generating assembly code directly from said optimized netlist, said generating of assembly code being for a computer system having a set of registers and a memory, said generating including:
      maintaining an ordered spill list indicating ones of said literals presently residing in one of said set of registers;
      determining when a spill is required from one of said set of registers; and
      setting an execution order for logical Boolean operations on said one or more inputs of each of said gates so that said operations involve inputs in the following order:
        (1) inputs with corresponding values residing in said set of registers with only one remaining reference in said netlist; then
        (2) an input identified in said ordered spill list as a next input to be spilled; then
        (3) inputs with corresponding values residing in said memory with only one remaining reference in said netlist; then
        (4) inputs with corresponding values residing in said set of registers; then
        (5) all inputs with corresponding values residing in said memory with only one remaining reference in said netlist; and then
        (6) all inputs with corresponding values residing in said memory.

22. The computer program product as set forth in claim 21, wherein said software instructions further enable said computer to perform said predetermined operations so that said step of representing said gates in software programming statements comprises generating assembly code directly from said optimized netlist, said generating of assembly code being for a computer system having a set of registers and a memory, said literals being stored with a given respective phase, said generating including:
  for each of said gates having two of said inputs, when only one inversion of said phase is indicated, using an ANDN assembly language instruction; and
  for each of said gates having two of said inputs, when inversion of both of said two inputs is indicated, computing said respective output in an inverted phase and recording the phase of said respective output.

23. The computer program product as set forth in claim 21, wherein said software instructions further enable said computer to perform said predetermined operations so that:
  said simulation is four-valued simulation; and
  said representing said gates in software programming statements comprises generating assembly code directly from said optimized netlist, said generating of assembly code being for a computer system having a set of registers and a memory, said generating including implementing two versions of an ANDN operation and two versions of an ORN operation, each of said two versions including one version in which a row variable is complemented and another version in which a column variable is complemented.

24. The computer program product as set forth in claim 21, wherein said software instructions further enable said computer to perform said predetermined operations so that, when said digital circuit has devices including one or more of flip-flops and latches, said optimizing of said input netlist comprises reducing a number of said devices by retiming said netlist according to a retiming algorithm.

25. A computer system for simulating delay-independent functions of an input netlist of Boolean logic gates of a synchronous digital circuit in response to a sequence of input vectors, said gates each having a respective gate fanin of one or more inputs and a respective gate fanout of zero or more outputs, said inputs and said outputs of all said gates defining literals of said netlist, the computer system comprising:
  a processor, and
  a memory including software instructions adapted to enable the computer system to perform the steps of:

optimizing said input netlist;
levelizing said optimized netlist;
representing each of said gates of said levelized netlist in software programming statements; executing a computer program, derived from said software programming statements, with said sequence of input vectors as input, to provide for each of said input vectors a corresponding output vector; and
whereby said output vector represents said delay-independent functions of said input netlist;
wherein said software instructions in said memory are further adapted to enable said computer system to perform said step so that said optimizing comprises:
eliminating ones of said gates which have, as said respective gate fanin, only one input;
eliminating ones of said gates which have, as said respective gate fanout, zero outputs;
collapsing ones of said gates, onto said respective gate fanout, when said collapsing reduces an overall number of said literals of said netlist; and
factoring selected ones of said gates from a sum-of-products form to a factored form.

26. The computer system as set forth in claim 25, wherein said software instructions in said memory are further adapted to enable said computer system to perform said steps so that said step of representing said gates in software programming statements comprises generating assembly code directly from said optimized netlist, said generating of assembly code being for a computer system having a set of registers and a memory, said literals being stored with a given respective phase, said generating including:
for each of said gates having two of said inputs, when only one inversion of said phase is indicated, using an ANDN assembly language instruction; and
for each of said gates having two of said inputs, when inversion of both of said two inputs is indicated, computing said respective output in an inverted phase and recording the phase of said respective output.

27. The computer system as set forth in claim 25, wherein said software instructions in said memory are further adapted to enable said computer system to perform said steps so that:
said simulation is four-valued simulation; and
said representing said gates in software programming statements comprises generating assembly code directly from said optimized netlist, said generating of assembly code being for a computer system having a set of registers and a memory, said genera ting including implementing two versions of an ANDN operation and two versions of an ORN operation, each of said two versions including one version in which a row variable is complemented and another version in which a column variable is complemented.

28. The computer system as set forth in claim 25, wherein said software instructions in said memory are further adapted to enable said computer system to perform said steps so that, when said digital circuit has devices including one or more of flip-flops and latches, said optimizing of said input netlist comprises reducing a number of said devices by retiming said netlist according to a retiming algorithm.

29. A computer system for simulating delay-independent functions of an input netlist of Boolean logic gates of a synchronous digital circuit in response to a sequence of input vectors, said gates each having a respective gate fanin of one more inputs and a respective gate fanout of zero or more outputs, said inputs and said outputs of all said gates defining literals of said netlist, the computer system comprising:

a processor, and
a memory including software instructions adapted to enable the computer system to perform the steps of:
optimizing said input netlist;
levelizing said optimized netlist;
representing each of said gates of said levelized netlist in software programming statements; executing a computer program, derived from said software programming statements, with said sequence of input vectors as input, to provide for each of said input vectors a corresponding output vector; and
whereby said output vector represents said delay-independent functions of said input netlist;
wherein said software instructions in said memory are further adapted to enable said computer system to perform said steps so that:
said levelizing comprises:
selecting one or more of said inputs for cofactoring, and
determining cofactored netlists by propagating, through said optimized netlist, constant values assigned to said one or more of said selected inputs, each of said cofactored netlists corresponding to said propagated constant values;
said representing said gates comprises generating sets of software programming statements, each corresponding to one of said cofactored netlists;
said executing said computer program comprises:
determining, for each of said input vectors, present constant values for said one or more selected inputs;
selecting, based on said present constant values and said propagated constant values, one of said cofactored netlists for execution; and
executing a portion of said computer program derived from one of said sets of software programming statements corresponding to said selected one of said cofactored netlists.

30. The computer system as set forth in claim 29, wherein said software instructions in said memory are further adapted to enable said computer system to perform said steps so that said step of representing said gates in software programming statements comprises generating assembly code directly from said optimized netlist, said generating of assembly code being for a computer system having a set of registers and a memory, said literals being stored with a given respective phase, said generating including:
for each of said gates having two of said inputs, when only one inversion of said phase is indicated, using an ANDN assembly language instruction; and
for each of said gates having two of said inputs, when inversion of both of said two inputs is indicated, computing said respective output in an inverted phase and recording the phase of said respective output.

31. The computer system as set forth in claim 29, wherein said software instructions in said memory are further adapted to enable said computer system to perform said steps so that:
said simulation is four-valued simulation; and
said representing said gates in software programming statements comprises generating assembly code directly from said optimized netlist, said generating of assembly code being for a computer system having a set of registers and a memory, said generating including implementing two versions of an ANDN operation and two versions of an ORN operation, each of said two versions including one version in which a row variable is complemented and another version in which a column variable is complemented.

32. The computer system as set forth in claim 29, wherein said software instructions in said memory are further adapted to enable said computer system to perform said steps so that, when said digital circuit has devices including one or more of flip-flops and latches, said optimizing of said input netlist comprises reducing a number of said devices by retiming said netlist according to a retiming algorithm.

33. A computer system for simulating delay-independent functions of an input netlist of Boolean logic gates of a synchronous digital circuit in response to a sequence of input vectors, said gates each having a respective gate fanin of one or more inputs and a respective gate fanout of zero or more outputs, said inputs and said outputs of all said gates defining literals of said netlist, the computer system comprising:

a processor, and a memory including software instructions adapted to enable the computer system to perform the steps of:
  optimizing said input netlist;
  levelizing said optimized netlist;
  representing each of said gates of said levelized netlist in software programming statements; and
  executing a computer program, derived from said software programming statements, with said sequence of input vectors as input, to provide for each of said input vectors a corresponding output vector;
  whereby said output vector represents said delay-independent functions of said input netlist; and
  wherein said software instructions in said memory are further adapted to enable said computer system to perform said steps so that said step of representing said gates in software programming statements comprises generating assembly code directly from said optimized netlist, said generating of assembly code being for a computer system having a set of registers and a memory, said generating including:
    maintaining an ordered spill list indicating ones of said literals presently residing in one of said set of registers;
    determining when a spill is required from one of said set of registers; and
    setting an execution order for logical Boolean operations on said one or more inputs of each of said gates so that said operations involve inputs in the following order:
      (1) inputs with corresponding values residing in said set of registers with only one remaining reference in said netlist; then
      (2) an input identified in said ordered spill list as a next input to be spilled; then
      (3) inputs with corresponding values residing in said memory with only one remaining reference in said netlist; then
      (4) inputs with corresponding values residing in said set of registers; then
      (5) all inputs with corresponding values residing in said memory with only one remaining reference in said netlist; and then
      (6) all inputs with corresponding values residing in said memory.

34. The computer system as set forth in claim 33, wherein said software instructions in said memory are further adapted to enable said computer system to perform said steps so that said step of representing said gates in software programming statements comprises generating assembly code directly from said optimized netlist, said generating of assembly code being for a computer system having a set of registers and a memory, said literals being stored with a given respective phase, said generating including:
  for each of said gates having two of said inputs, when only one inversion of said phase is indicated, using an ANDN assembly language instruction; and
  for each of said gates having two of said inputs, when inversion of both of said two inputs is indicated, computing said respective output in an inverted phase and recording the phase of said respective output.

35. The computer system as set forth in claim 33, wherein said software instructions in said memory are further adapted to enable said computer system to perform said steps so that:
  said simulation is four-valued simulation; and
  said representing said gates in software programming statements comprises generating assembly code directly from said optimized netlist, said generating of assembly code being for a computer system having a set of registers and a memory, said generating including implementing two versions of an ANDN operation and two versions of an ORN operation, each of said two versions including one version in which a row variable is complemented and another version in which a column variable is complemented.

36. The computer system as set forth in claim 33, wherein said software instructions in said memory are further adapted to enable said computer system to perform said steps so that, when said digital circuit has devices including one or more of flip-flops and latches, said optimizing of said input netlist comprises reducing a number of said devices by retiming said netlist according to a retiming algorithm.

* * * * *